US009318473B2

(12) United States Patent
Mahler et al.

(10) Patent No.: US 9,318,473 B2
(45) Date of Patent: Apr. 19, 2016

(54) SEMICONDUCTOR DEVICE INCLUDING A POLYMER DISPOSED ON A CARRIER

(75) Inventors: Joachim Mahler, Regensburg (DE); Khalil Hosseini, Weihmichl (DE); Edward Fuergut, Dasing (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 13/451,930

(22) Filed: Apr. 20, 2012

(65) Prior Publication Data

US 2013/0277824 A1 Oct. 24, 2013

(51) Int. Cl.
*H01L 23/34* (2006.01)
*H01L 23/48* (2006.01)
(Continued)

(52) U.S. Cl.
CPC .............. *H01L 25/16* (2013.01); *H01L 21/561* (2013.01); *H01L 23/295* (2013.01); *H01L 23/49805* (2013.01); *H01L 23/5389* (2013.01); *H01L 24/24* (2013.01); *H01L 24/27* (2013.01); *H01L 24/29* (2013.01); *H01L 24/30* (2013.01); *H01L 24/33* (2013.01); *H01L 24/48* (2013.01); *H01L 24/743* (2013.01); *H01L 24/82* (2013.01); *H01L 24/83* (2013.01); *H01L 24/92* (2013.01); *H01L 25/50* (2013.01); *H01L 23/562* (2013.01); *H01L 24/32* (2013.01); *H01L 24/97* (2013.01); *H01L 2224/2402* (2013.01); *H01L 2224/245* (2013.01); *H01L 2224/24011* (2013.01); *H01L 2224/24137* (2013.01); *H01L 2224/2732* (2013.01); *H01L 2224/2784* (2013.01); *H01L 2224/27312* (2013.01); *H01L 2224/27318* (2013.01); *H01L 2224/27416* (2013.01); *H01L 2224/27422* (2013.01); *H01L 2224/27438* (2013.01); *H01L 2224/27848* (2013.01); *H01L 2224/2919* (2013.01); *H01L 2224/2929* (2013.01); *H01L 2224/2939* (2013.01); *H01L 2224/29076* (2013.01); *H01L 2224/29078* (2013.01); *H01L 2224/29387* (2013.01); *H01L 2224/30505* (2013.01); *H01L 2224/3201* (2013.01); *H01L 2224/32225* (2013.01); *H01L 2224/32245* (2013.01); *H01L 2224/33505* (2013.01); *H01L 2224/4814* (2013.01); *H01L 2224/48091* (2013.01); *H01L 2224/48137* (2013.01); *H01L 2224/48151* (2013.01); *H01L 2224/73265* (2013.01); *H01L 2224/73267* (2013.01); *H01L 2224/82101* (2013.01); *H01L 2224/82104* (2013.01); *H01L 2224/82105* (2013.01); *H01L 2224/82106* (2013.01);

(Continued)

(58) Field of Classification Search
CPC ... H01L 2924/06; H01L 23/52; H01L 23/538; H01L 23/5383; H01L 24/83
USPC .................. 257/723, 724, 734, 783, E23.169, 257/E23.141
See application file for complete search history.

(56) References Cited

U.S. PATENT DOCUMENTS 5,682,066 A * 10/1997 Gamota et al. ................. 257/783
6,291,880 B1 * 9/2001 Ogawa et al. .................. 257/723

(Continued)

FOREIGN PATENT DOCUMENTS

CN 101419963 B 5/2011
DE 10 2008 025 451 A1 12/2008

*Primary Examiner* — Robert Huber
(74) *Attorney, Agent, or Firm* — Slater & Matsil, L.L.P.

(57) ABSTRACT

In a method of manufacturing a semiconductor device, a first semiconductor element is mounted on a carrier. A b-stage curable polymer is deposited on the carrier. A second semiconductor element is affixed on the polymer.

25 Claims, 10 Drawing Sheets

(51) Int. Cl.
- *H01L 23/52* (2006.01)
- *H01L 29/40* (2006.01)
- *H01L 25/16* (2006.01)
- *H01L 23/498* (2006.01)
- *H01L 21/56* (2006.01)
- *H01L 23/538* (2006.01)
- *H01L 23/29* (2006.01)
- *H01L 25/00* (2006.01)
- *H01L 23/00* (2006.01)

(52) U.S. Cl.
CPC ......... *H01L 2224/83192* (2013.01); *H01L 2224/83801* (2013.01); *H01L 2224/83825* (2013.01); *H01L 2224/83856* (2013.01); *H01L 2224/83862* (2013.01); *H01L 2224/83951* (2013.01); *H01L 2224/92244* (2013.01); *H01L 2224/92247* (2013.01); *H01L 2224/97* (2013.01); *H01L 2924/00014* (2013.01); *H01L 2924/12042* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/15787* (2013.01); *H01L 2924/181* (2013.01)

(56) References Cited

U.S. PATENT DOCUMENTS

| | | | |
|---|---|---|---|
| 7,772,693 B2 * | 8/2010 | Koller et al. | 257/724 |
| 7,847,375 B2 | 12/2010 | Mahler et al. | |
| 7,868,465 B2 | 1/2011 | Otremba et al. | |
| 2008/0169557 A1 * | 7/2008 | Tsao et al. | 257/723 |
| 2008/0296782 A1 * | 12/2008 | Otremba et al. | 257/783 |

* cited by examiner

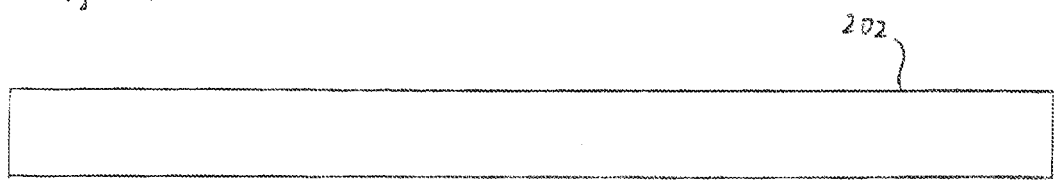
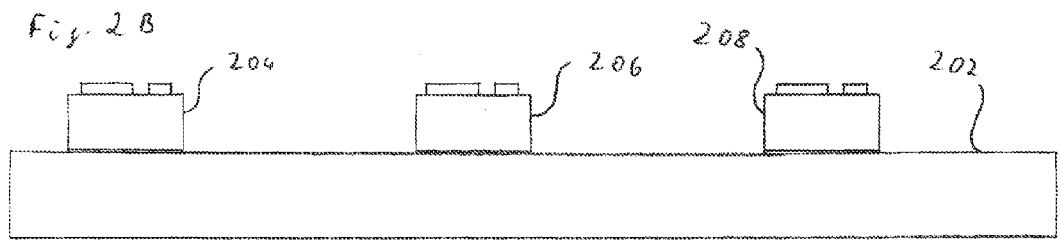
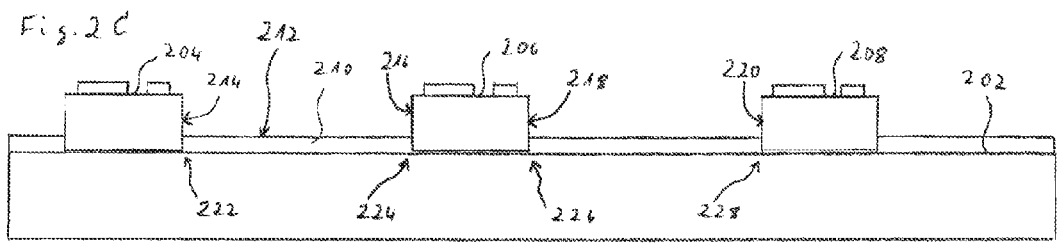
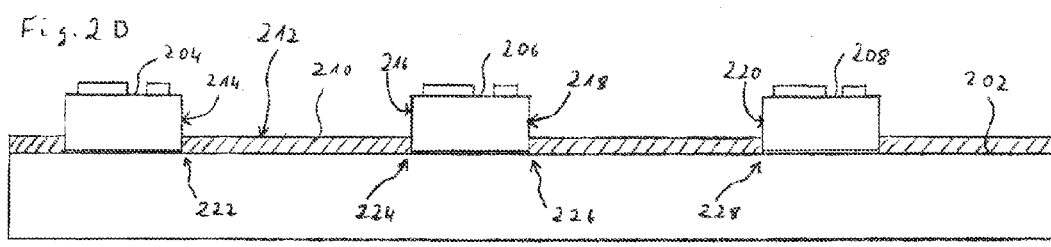

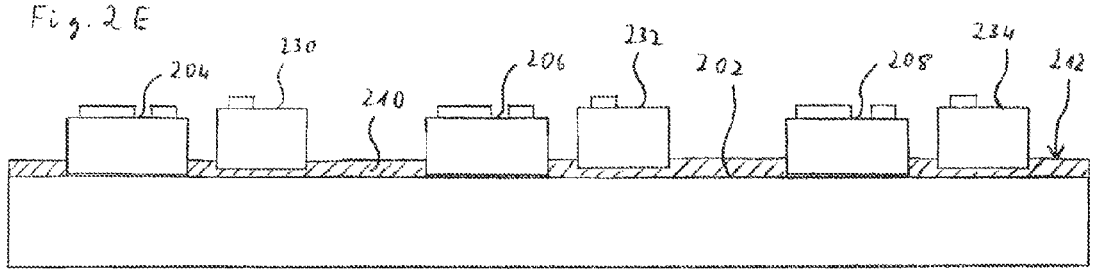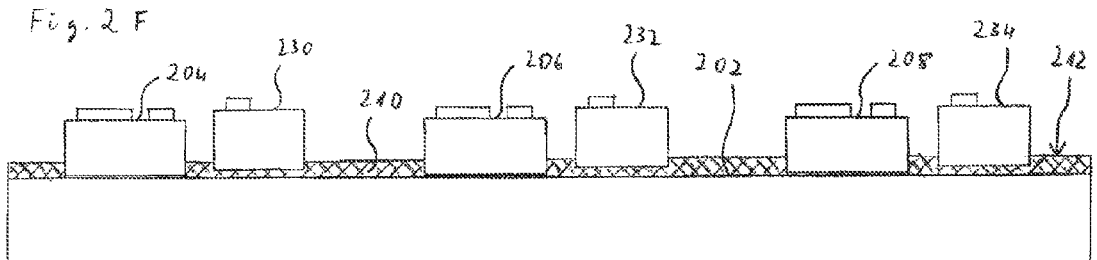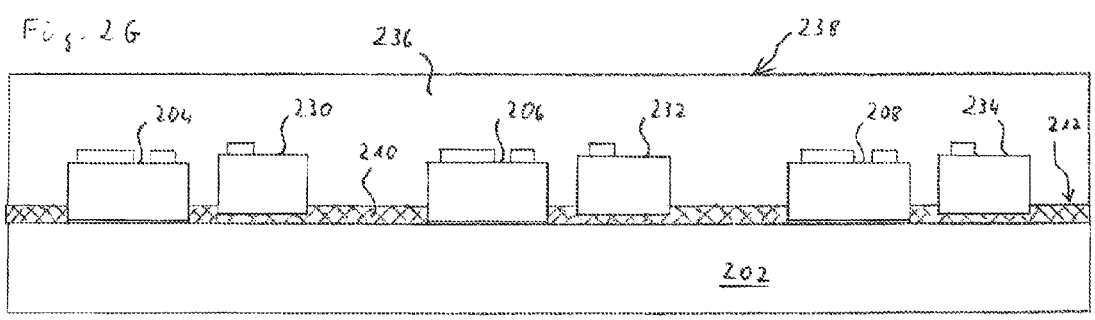

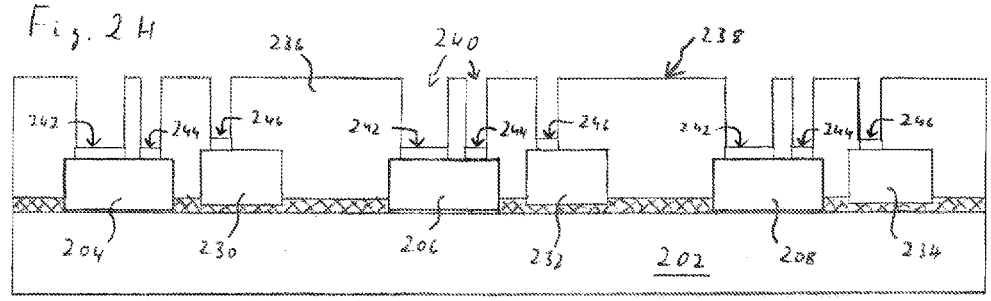
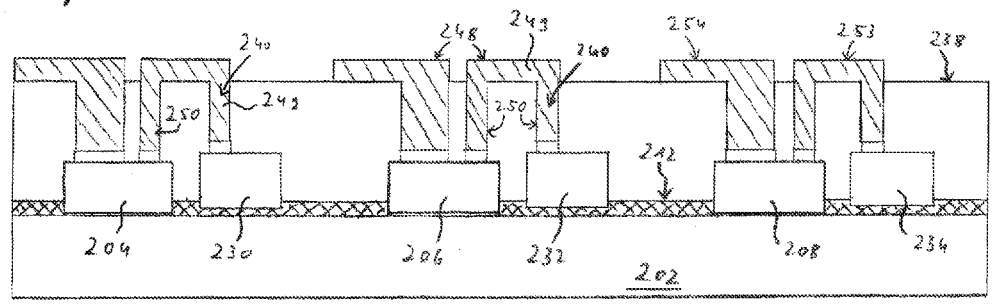
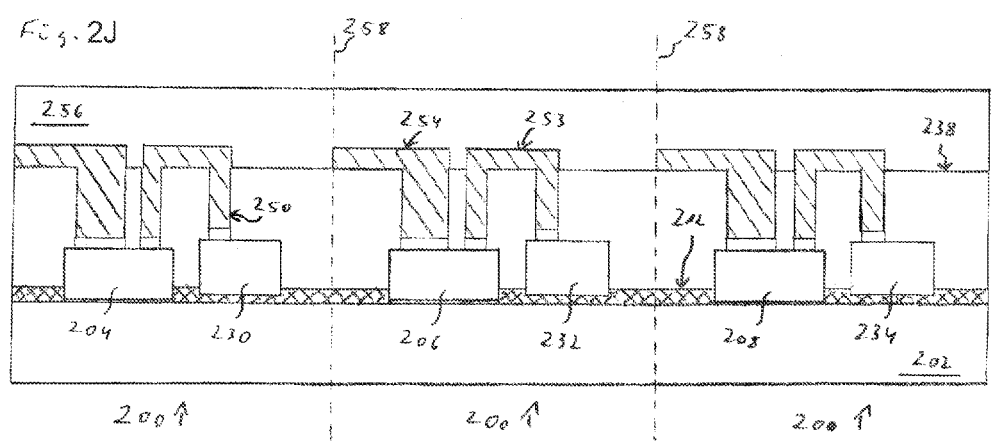

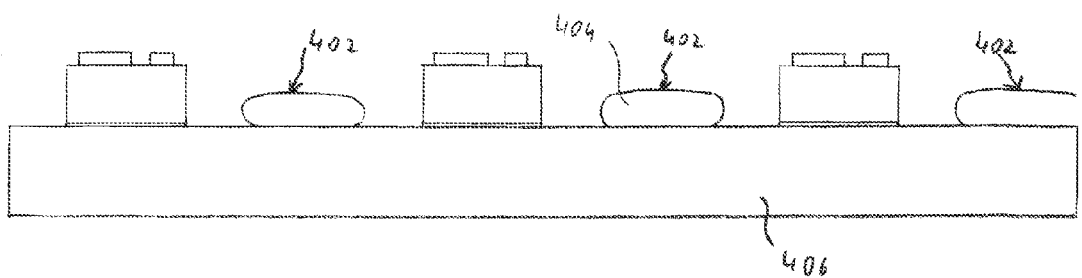
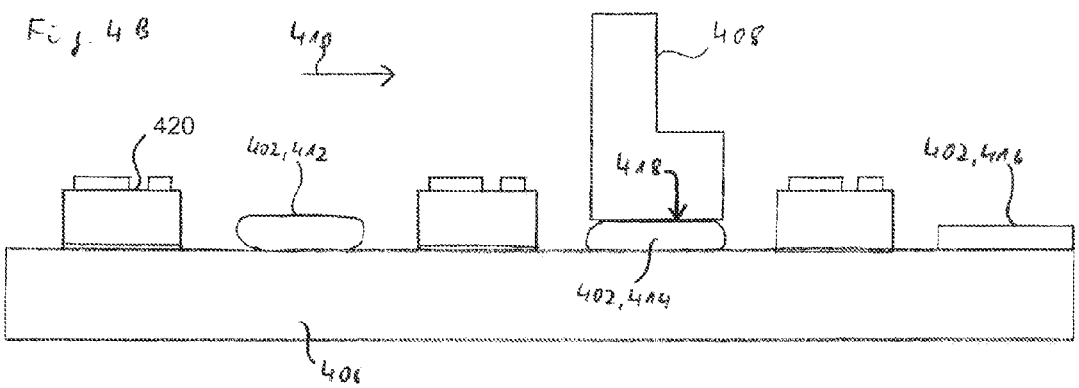

SEMICONDUCTOR DEVICE INCLUDING A POLYMER DISPOSED ON A CARRIER

TECHNICAL FIELD

The present invention relates to a method of manufacturing a semiconductor device, a semiconductor device, and a method of using a b-stage curable polymer.

BACKGROUND

Semiconductor devices can comprise multiple semiconductor elements supported by a carrier, wherein one or more of the elements are to be electrically insulated from the carrier. Multi-chip packages can comprise, for instance, one or more semiconductor power chips and one or more logic and/or memory chips, for example, for controlling the power chips. Such devices can generally be used for controlling and switching high electric currents and voltages, or may serve more specifically as switches or rectifiers in power electronic circuits.

SUMMARY OF THE INVENTION

According to one embodiment, a carrier is provided. A first semiconductor element is mounted on the carrier. A b-stage curable polymer is deposited on the carrier. A second semiconductor element is affixed on the polymer.

BRIEF DESCRIPTION OF THE DRAWINGS

The accompanying drawings are included to provide a thorough understanding of various embodiments and are incorporated in and constitute a part of this specification. The drawings illustrate different embodiments and together with the description serve to explain miscellaneous aspects thereof. Other embodiments and advantages intended by the embodiments will be readily appreciated and become better understood by reference to the following detailed description.

In the figures and the description like reference numerals are generally utilized to refer to like elements throughout. It is to be noted that the various elements and structures shown in the figures are not necessarily drawn to scale. Features and/or elements are illustrated with particular dimensions relative to each other primarily for the sake of clarity and ease of understanding; as a consequence, relative dimensions in factual implementations may differ substantially from those illustrated herein.

FIGS. 2A-2J illustrate a second embodiment of a manufacturing method for a semiconductor device;

FIGS. 4A, 4B illustrate a fourth embodiment of a manufacturing method for a semiconductor device;

DETAILED DESCRIPTION OF ILLUSTRATIVE EMBODIMENTS

Figure 1A:
FIGS. 1A-1D schematically illustrate a first embodiment of a method of manufacturing a semiconductor device.
Figure 1B:
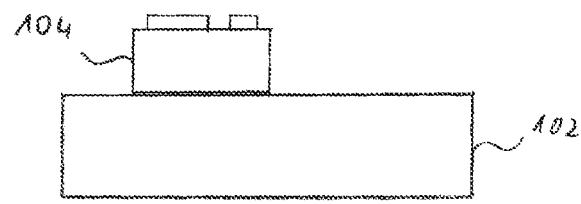

In the following description, for purposes of explanation and not limitation, by reference to the accompanying drawings, various embodiments are set forth including many specific details thereof in order to provide a thorough understanding of the current invention. It is to be understood that other embodiments, which differ in one or more of these specific details, can be practiced without departing from the scope of the present invention. Accordingly, the following description is intended for illustrative, non-limiting purposes only, and the scope of the present invention shall be defined by the appended claims.

It will further be appreciated that the features of the various exemplary embodiments described herein can be combined with each other, unless specifically noted otherwise.

Semiconductor devices are described below, which can comprise one or more semiconductor elements. Exemplary implementations of such devices which comprise multiple semiconductor chips may be referred to as multi-chip packages, for example, in an environment wherein manufacturing of semiconductor devices is performed on a wafer level. For instance, the semiconductor device can be a chip-scale package (CSP) resulting from wafer level packaging techniques.

In these or other devices, the one or more semiconductor elements can be provided in association with a carrier. Carriers as referred to herein may be of any material, size, and shape. The carrier may be manufactured from one or more metal materials including metal alloys, such as, for example, nickel, copper, steel, stainless steel, aluminum, etc., and/or can be made from or comprise any other electrically conductive material. Additionally or alternatively the carrier can comprise a ceramic material, such as aluminum oxide, and/or any other electrically insulating material. Additionally or alternatively the carrier can comprise a semiconducting material such as silicon. Generally, the carrier can be made from, or comprise, and/or can be coated with, a silicon material such as mono-crystalline silicon, silicon carbide, silicon dioxide, etc.

The carrier can be coated with an electrically conductive material such as copper. An insulating carrier body can, for example, be coated or covered with a (structured) conductive layer, a (structured) conductive plate such as a structured copper plate. A coating can also comprise a galvanic layer covering at least portions of the carrier. Example realizations of carriers can comprise substrates, such as metallic or ceramic substrates, leadframes, etc.

Semiconductor elements as referred to herein can be manufactured based on semiconducting materials such as Si, SiC, SiGe, GaAs, etc., and may generally comprise inorganic and/or organic materials that are not semiconductors such as insulators, metals, plastics, etc. Realizations of semiconductor elements can comprise passive or active elements such as resistors, capacitors, electrical, electro-optical and/or electro-mechanical circuitry, integrated circuits (ICs) and semiconductor chips.

Implementations of semiconductor chips may include power chips such as, for example, power diodes, power bipolar transistors, IGBTs (Insulated Gate Bipolar Transistors), JFETs (Junction gate Field-Effect Transistors), power MOSFETs (Metal Oxide Semiconductor Field-Effect Transistors), etc. Additionally or alternatively, semiconductor chips can include control circuitry, control logic, logic ICs, microprocessors, microcontrollers, etc. Additionally or alternatively, semiconductor chips can include memory facilities, wherein the chips hold data and/or programs temporarily or permanently, including RAM (Random Access Memory) chips, ROM (Read Only Memory) chips, flash memory chips, etc.

Realizations of semiconductor devices can comprise power chips as well as logic and/or memory chips, the latter chips being adapted for controlling the power chips.

One or more semiconductor elements can be coupled electrically to the carrier. Generally, the terms "coupled" and/or "electrically coupled" do not imply that any elements are directly coupled together. Intervening elements can be provided between the coupled elements. Generally, any of the semiconductor elements arranged in a semiconductor device can be electrically coupled to each other and/or the carrier and/or externally.

One or more semiconductor elements, for example, power chips, can be mounted onto a carrier by soldering, for example, diffusion soldering. A diffusion of material used for soldering, such as copper, to the sidewalls of the chips, can lead to electric malfunction. For example, CuSi can form on the silicon side surfaces of semiconductor elements even in a laminated or molded device in case of a deficient adherence of a laminate or mold component to the chip side surfaces and/or the carrier, i.e., a metal substrate or metal layer.

One or more semiconductor elements can be electrically insulated from the carrier. For example, a multi-chip device can comprise a power chip which is electrically coupled or connected with a carrier which may function as a power bus. The power chip may also be bonded to a logic chip provided for control of the power chip. The power chip may further be electrically connectable towards an external environment of the device. The logic chip may be electrically insulated from the power rail (carrier). One or more of the elements of the device and the carrier can be encapsulated into a molding component, a laminate, a prepreg material, etc., wherein laminating or molding techniques such as compression molding or injection molding can be employed.

Herein, it is referred to as b-stage curable polymers, which are to be understood as polymers which are generally curable in two stages referred to as a pre-curing stage and a (final) curing stage. Such polymers generally are flowable after deposition onto, for example, a carrier surface, and/or are flowable during pre-curing. During and after final curing, when cross-linking of the polymer material generally has completed, the material is typically no longer flowable.

Generally, a flowability of a b-stage curable polymer during and after deposition or application, and/or during pre-curing may be controlled, for example, by configuring a viscosity of the polymer accordingly. The polymer may be applied in form of a paste, a gel, and/or other viscous or fluidic form, a foil, etc. The polymer may be deposited or applied using a variety of techniques including one or more of spin-coating, dip-coating, printing techniques including ink-jet printing, screen-printing, dispensing, laminating techniques such as film lamination, depositing a foil or foils, etc.

A b-stage curable polymer may be pre-cured and/or finally cured by application of, e.g., heat, UV radiation, gamma radiation or other techniques. According to various embodiments, a pre-curing may be achieved by application of heat in a first temperature range, and/or by an application of ultraviolet radiation, while a final curing may be achieved by application of heat in a second temperature range, and/or by an application of gamma radiation.

A b-stage curable polymer can comprise one or more of various materials including, for example, teflon-type polymers, polyimides, polyimide-polymers, etc. The polymer may comprise an adhesive. For example, the adhesive may comprise an epoxy adhesive in the form of a (b-stage) resin, an acrylic adhesive in the form of a (b-stage) resin, a thermosetting polymer including an epoxy resin and a polyamine hardener, etc. Also fiber-reinforced plastic materials may be employed.

The polymer or the adhesive may comprise one or more filler materials. The filler materials may be electrically insulating and may comprise, for example, $SiO_2$, $Si_3$, $N_4$, AlN, BN, PTFE. The materials may be provided in particle form and/or fiber-based including fiber-mats, prepregs, etc. Fibers may be in a range of, for example, 1-10 micrometers in length or diameter.

The filler material may lead to a CTE (Coefficient of Thermal Expansion) of the polymer which is similar to the CTE of the carrier and/or one or more semiconductor elements of the device. Exemplarily, silicon may have a CTE of about 2.5, while copper may have a CTE of about 16.5. The polymer may be adapted for comparable CTE values by providing an appropriate fraction of filler material. For example, a filler such as $SiO_2$ may be provided with any filling level between 5% and 95% by volume to achieve a desired CTE.

The polymer material may be used to provide for adhesive properties, electrical insulation properties, and/or encapsulation properties such as contributing to mechanical reliability, mechanical protection and/or mechanical stability for the semiconductor device or components thereof. Encapsulation of the device may include removal of polymer material, for example, in order to provide for recesses, through-holes, vias ("vertical interconnect access") or trenches. Corresponding techniques may include one or more of laser beam techniques, water-jet techniques, mechanical sawing using a saw or cutter, chemical etching, milling, etc.

Electrically conductive material may be deposited in a recess, through-hole, etc., for example in order to provide for an electrical connection such as an electrical through-connection. An electrical connection may provide for an electrical coupling of two or more semiconductor elements of the device. As an example, device chips may be electrically interconnected. Additionally or alternatively, external connections may be provided, for example, in order to provide an external connectivity for a chip encapsulated in the device.

In order to provide for electrical conductivity, a paste which may contain metal particles may be employed for plating or filling purposes, for example, for partially or totally filling or plating a recess, via, through-hole, etc., or for deposition on any other surface of the device. The metal particles may, for example, comprise silver, gold, copper, tin or nickel. The metal particles may have sizes (e.g., average diameters) smaller than 100 nanometers, or smaller than 50 nanometers, or smaller than 10 nanometers. The sizes of the metal particles may follow a distribution according to which only a fraction of all particles have sizes in the nanometer range, while another particle fraction has larger sizes. The metal particles may be coated with a layer of an organic material or a flux material such as colophony. Furthermore, the metal particles may be dispersed in a suitable liquid or solvent. After their application, the metal particles may be heated and thereby sintered.

FIGS. 1A to 1D schematically illustrate an embodiment of a method of manufacturing a semiconductor device. According to FIG. 1A, a carrier 102 is provided, which may be metal, or may be a non-metal, e.g., a ceramic carrier with a structured conductive layer or plating. According to FIG. 1B, a first semiconductor element 104 is mounted on the carrier 102. By way of example, the element 104 may be a power chip, wherein the process of mounting the chip 104 to the carrier 102 may comprise a soldering of the chip 104 to the carrier 102.

Figure 1C:
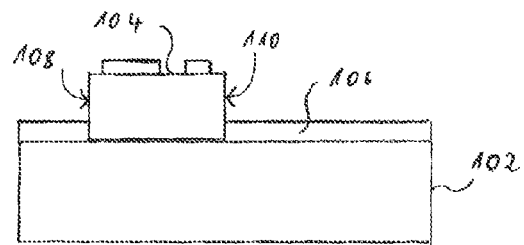

Referring to FIG. 1C, a b-stage curable polymer 106 is deposited on the carrier 102. The polymer 106 may be applied to the free surface of the carrier 102, i.e., those parts of the surface of the carrier 102 not covered by element 104. Direct contact of the polymer 106 with at least a part of side surfaces 108, 110 of element 104 may be established, for example, by providing for a sufficient flowability of the polymer 106 during deposition and/or during a pre-curing.

Figure 1D:
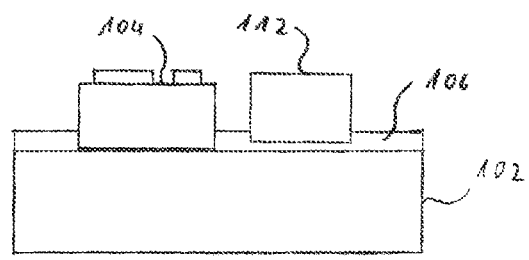

According to FIG. 1D, a second semiconductor element 112 is affixed on the polymer 106. The polymer 106 may have been pre-cured prior to affixing. The semiconductor element 112 may comprise a semiconductor chip with a logic IC and/or memory facilities. One or both of elements 104 and 112 may be positioned by way of techniques such as pick-and-place, transfer foils, etc.

FIGS. 2A to 2J illustrate an embodiment of a method of manufacturing a semiconductor device 200, wherein a cross-section of device 200 is depicted in FIG. 2J. The manufacturing method 200 may be a variant of the manufacturing method 100 illustrated in FIGS. 1A to 1D. Vice versa, details of the manufacturing method 200 described in the following may likewise be applied to the method 100 of FIGS. 1A to 1D.

In FIG. 2A a carrier 202 is provided which may comprise, for example, a metal or metallized chip-carrier. According to FIG. 2B, power chips 204, 206 and 208 are soldered onto the chip-carrier 202. By way of example, soldering may be performed at temperatures at or above 300° C. Referring to FIG. 2C, a b-stage curable polymer, namely an adhesive 210 is deposited on the carrier 202, more precisely the free area on the carrier 202 not covered by the power chips 204, 206 and 208. The adhesive 210 may be applied in the form of a paste, a gel, or any other viscous composition, or may be applied as a foil or film. The adhesive 210 may have electrically insulating properties. The polymer or adhesive 210 forms an adhesive layer 212 which is illustrated to be thin in comparison to, for example, the chips 204, 206 and 208. As an exemplary value, the adhesive layer 212 may have a thickness of about (or less than) 50 micrometer, or less than 30 micrometer, or less than 10 micrometer.

The deposition of the adhesive layer 212 on the carrier 202 may be performed with one or more of various techniques such as spin-coating, dip-coating, ink-jet printing or dispensing. It is illustrated in FIG. 2C that the adhesive layer 212 entirely covers the free space between the chips 204, 206 and 208, implying that the adhesive 210 is in direct contact with side surfaces 214, 216, 218 and 220, for example, of the chips 204, 206 and 208 and covers lower edges 222, 224, 226 and 228, for example, of the chips 204, 206 and 208 (wherein "lower" is to be understood as "facing towards the carrier 202"). The direct contact may be achieved by depositing the adhesive 210 accordingly, and/or the adhesive 210 has an appropriate flowability after deposition (before pre-curing).

More specifically, a deposition of the adhesive on the carrier 202 may comprise covering a free area of the carrier 202 to at least 75%, or at least 90%, or at least 95%, or at least 99%, or at least 100%. The degree of coverage may depend on the desired degree of direct contact of the adhesive with the side surfaces of the chips, and/or on the flowability of the adhesive after deposition and/or during pre-curing. For example, a high flowability of the adhesive lessens the requirement on the coverage of the free area of the carrier during deposition.

Referring to FIG. 2D, after deposition of the adhesive 210, the adhesive layer 212 is pre-cured. The pre-cured property of the adhesive 210 is depicted in FIG. 2D and other figures by single line shading of the adhesive layer 212. The pre-curing may be performed by applying heat to the adhesive 210; for example, the adhesive 210 may be heated to a temperature in the range of 80° C. to 150° C. Additionally or alternatively, radiation such as ultra-violet radiation may be employed for pre-curing. As discussed above, a flowing of the adhesive 210 during pre-curing may at least contribute to the adhesive layer 212 getting into direct contact with side surfaces of the mounted chips 204, 206 and 208.

Referring to FIG. 2E, semiconductor elements 230, 232 and 234 are affixed onto the pre-cured adhesive layer 212. By way of example, the elements 230, 232 and 234 may be logic and/or memory chips intended for controlling an operation of the power chips 204, 206 and 208, respectively. The chips 230, 232 and 234 may be positioned using sequential and/or parallel techniques such as pick and place, fixation to transfer films, etc.

According to FIG. 2F, a final curing is applied to the adhesive layer 212, which is indicated by crossed-lined shading. The final curing may be performed by application of heat, for example, at a temperature above 150° C., e.g., at a temperature or temperatures in a range of 170° C. to 250° C. In a specific example embodiment, a final curing may be performed with temperatures in the range of 175° C. to 200° C.

After final curing the adhesive 210 is fully cross-linked and the chips 230, 232 and 234 are affixed to the carrier 202, while being electrically insulated from the carrier 202 by layer 212. The adhesive layer 212 of cured adhesive 210 continues to be in direct contact with at least portions of the side surfaces the power chips 204, 206 and 208. Where the cured adhesive layer 212 is in direct contact with side surfaces of the chips 204, 206 and 208, a diffusion of solder material from soldering (FIG. 2B) to the side surfaces of the chips, e.g., during an operation of the device 200 may be prevented.

Referring to FIG. 2G, the semiconductor chips 204, 230, 206, 232, 208 and 234 are encapsulated with an encapsulation material 236 to form an encapsulation layer 238. The encapsulation may comprise a molding process, lamination process, dispensing process, etc. By way of example, the molding process may comprise one or more of compression molding, injection molding, powder molding, liquid molding, etc. While not shown in the figures, the encapsulation may not only comprise encapsulation of the chips and/or semiconductor elements, but also encapsulation of one or more sides/surfaces of the carrier.

Accordingly, the encapsulation material 236 may comprise one or more of a mold material, a lamination material, or any other encapsulant material. The encapsulation material 236 may comprise a dielectric material. The encapsulation material 236 may comprise a thermoplastic or thermosetting material. The material encapsulation 236 may comprise a fiber material and/or a prepreg material. The encapsulation material 236 may comprise one or more filler materials, which will be discussed in more detail further below.

According to FIG. 2H, channels 240 are provided extending through the encapsulation layer 238. The channels 240 are referred to generally as through-holes below, which does not exclude the channels 240 having slit-like or column-like shapes. The channels 240 may be established by drilling, for example, mechanical drilling or laser drilling. Additionally or alternatively, photochemical processes, such as photolithography or etching, or still other processes may be employed. The channels 240 extend through the encapsulation layer or body 238 and thereby uncover, for example, connection pads 242, 244 of the power chips 204, 206 and 208, and further act to uncover, for example, contact pads 246 of logic/memory chips 230, 232 and 234. Therefore the contacts pads 242, 244, 246 are available for electrical connection.

According to FIG. 2I, electrical connections 248 are provided for connecting the power chips 204, 206 and 208 as well as the logic chips 230, 232 and 234. Specifically, the channels 240 are filled (or plated) with a conductive material 249, which may comprise, for example a metal, metal alloy and/or a solder material. The conductive material 249 may be applied for instance by printing techniques. By way of example, a solder paste may be squeezed into the channels 240 by using a screen printing process. The conductive material 249 forms conductive elements 250 extending through the channels 240.

In the same or in one or more subsequent process steps the conductive elements 250 may be electrically connected internally or externally in a conductive layer 252. Any appropriate technique or combination of techniques may be used for forming the structured layer 252, for example galvanic techniques or other deposition methods, etching techniques or other structuring techniques. By way of example, a metal sheet, e.g. a copper plate may be positioned on top of the encapsulant layer 238 and the conductive elements 250. The metal sheet may be pre-structured and/or may be structured after positioning to form, e.g., desired electrically conducting lines. In the example configuration depicted in FIG. 2I, the conductive layer 252 provides for interconnection 253 of the power chips 204, 206 and 208 with the logic chips 230, 232 and 234, respectively, and further provides for external connectivity by connections 254 enabling a connection of each of the power chips 204, 206 and 208 to external.

According to FIG. 2J, the conductive layer 252 is mechanically and/or electrically insulated by depositing a protection layer 256 on top thereof. The layer 256 may comprise an electrically insulating material applied during a mold process. Multiple semiconductor devices 200 are formed by separation or singulation along vertical areas indicated by dashed lines 258 in the projection of FIG. 2J. The singulation may include one or more of sawing, cutting, laser-cutting, drilling, etching, etc.

Figure 3A:
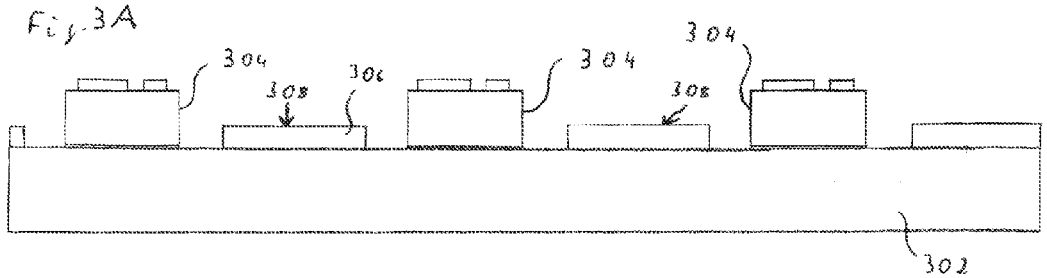
FIGS. 3A, 3B illustrate a third embodiment of a manufacturing method for a semiconductor device.
Figure 3B:
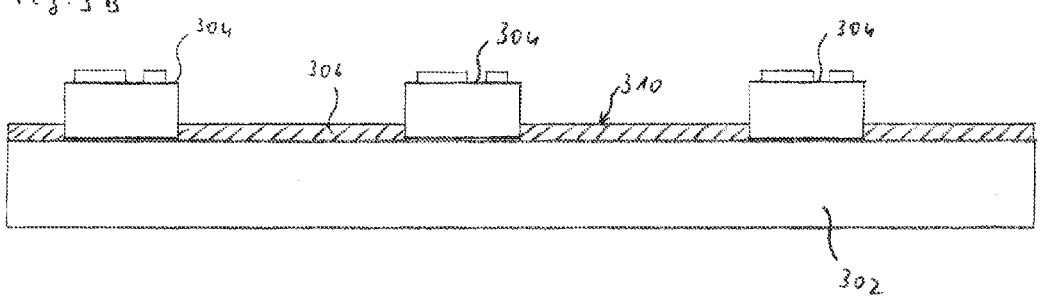

A variant of the manufacturing method illustrated in FIGS. 2A to 2J is schematically illustrated in FIGS. 3A and 3B. FIG. 3A illustrates a carrier 302 with chips 304 soldered onto a surface thereof. According to FIG. 3A, a polymeric adhesive 306 is deposited in the free area of carrier 302 not covered by the chips 304 selectively on a limited portion thereof, as illustrated by spots 308. It is to be noted that the deposition of the adhesive 306 in form of the spots 308 may, for example, be performed with a dispense technique, a printing technique, by applying an accordingly structured adhesive foil, etc. The deposition of the spots 308 may be performed in sequential process steps, or in a parallel process, or both. For example, some or all of the spots 308 depicted in FIG. 3A may be deposited in parallel.

The free area of carrier 302 is partially coated only, which includes that the spots 308 may have no or only limited contact with side surfaces of the chips 304 after deposition.

More specifically, a flowability of the adhesive 306 may not be sufficient to form an adhesive layer covering essentially the entire free area of carrier 302 and getting into contact with the chips 304. Therefore, after deposition the spots 308 remain as isolated spots and/or as an interconnected network of spots. The spots 308 may cover after deposition (and possibly a limited degree of spreading) a free area of the carrier 302 to a degree of less than 50%, or less than 30%, or may cover a footprint of the semiconductor elements intended to be fixed by the adhesive 306, or less, for example, in case the footprint is intended to be reached only during pre-curing.

According to FIG. 3B the adhesive 306 is pre-cured, wherein pre-curing techniques may be applied as has been discussed with reference to FIG. 2D. As illustrated in FIG. 3B, during pre-curing the adhesive 306 flows, due to an increase in flowability of the adhesive 306, and a degree of coverage of the free area of carrier 302 by the adhesive 306 is increased. In this way, the adhesive 306 may form an adhesive layer 310 which also is in direct contact with side surfaces or side walls of the chips 304. The resulting configuration therefore is similar to that discussed with reference to FIG. 2D. Subsequent process steps may be applied to the configuration shown in FIG. 3B as has been discussed in detail for FIGS. 2E to 2J.

A variant of the manufacturing methods illustrated in FIGS. 2A to 2J and 3A to 3B is shown in FIGS. 4A and 4B. Spots 402 of adhesive 404 are deposited on a carrier 406, wherein the spots 402 may be applied, for example, by any of the techniques discussed in this respect for the spots 308 of FIG. 3A. A flowability of the adhesive 404 during and after the deposition process (before pre-curing) may be low, which may imply that after a deposition of the spots 402 these essentially retain their form and spread on the surface of the carrier 406.

FIG. 4B illustrates a planarization of the spots 402 by means of a spanker 408 which exerts mechanical pressure onto the spots 402. The processing of the spots 402 via spanking is shown in FIG. 4B along an indexing direction 410. The deposited, drop-like spot 402, 412 is transformed via application of the spanker 408 to spot 402, 414 into a sheet-like or flattened spot 402, 416, e.g. due to the spanker 408 exerting mechanical pressure on the spots 402. Due to the flattening the spot 402 spreads over the carrier 406, and a footprint of the spot 416 is larger than that of the original spot 412. According to some embodiments, a footprint of the flattened or spreaded dots 416 may be comparable to a footprint of the chips intended for being affixed by the spots 416 on the carrier 406.

While only a single spanker 408 is illustrated in FIG. 4B, the spanking process may be implemented as a parallel process by providing, for example, one or more rows of spankers which operate in parallel on one or more corresponding rows of adhesive spots. The spanker 408 may have a base or sole 418 for interaction with the spots 402 with an area comparable to or larger than the footprint of the chips to be affixed. Various embodiments of the spanker 408 comprise an anti-stick base 418, wherein the anti-stick property may be implemented, for example, by providing the spanker or its base comprising an anti-stick material, and/or providing an anti-stick coating at the base 418, for example, a teflon-coating, such that a sticking of the adhesive 404 at the spanker 408 may be minimized.

After spanking (additionally or alternatively, any other technique for a planarization of the spots 402 may be applied) a further processing may follow as discussed with reference to FIGS. 2D to 2J or FIG. 3B. For example, after planarization as illustrated in FIG. 4B, the flattened spots 402, 416 may be pre-cured, wherein during pre-curing the adhesive 404 may get into direct contact with side surfaces of the chips 420. Additionally or alternatively, such direct contact may already prior to pre-curing be established by a spanking process similar to that illustrated in FIG. 4B.

Figure 5A:
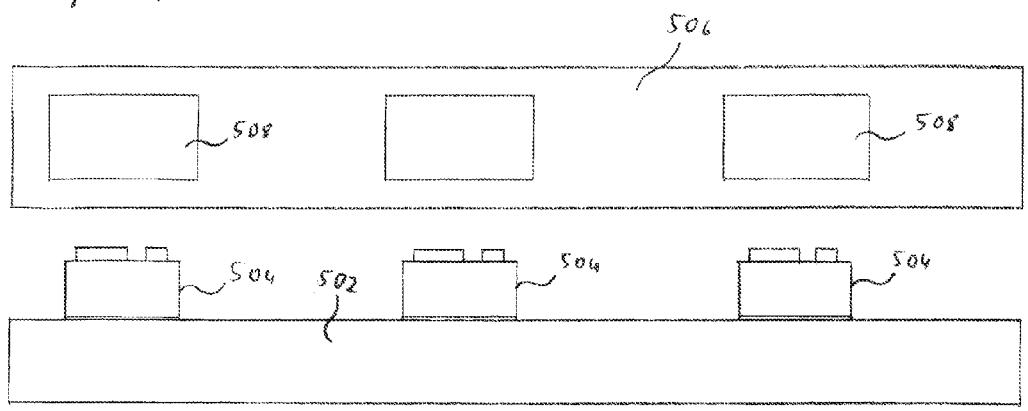
FIGS. 5A-5C illustrate a fifth embodiment of a manufacturing method for a semiconductor device.
Figure 5B:
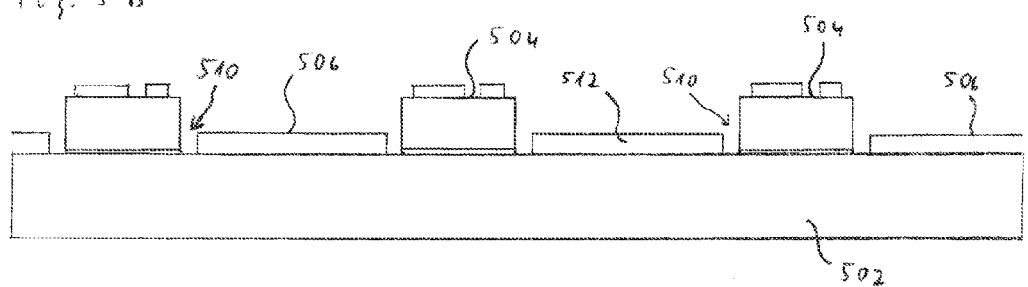
Figure 5C:
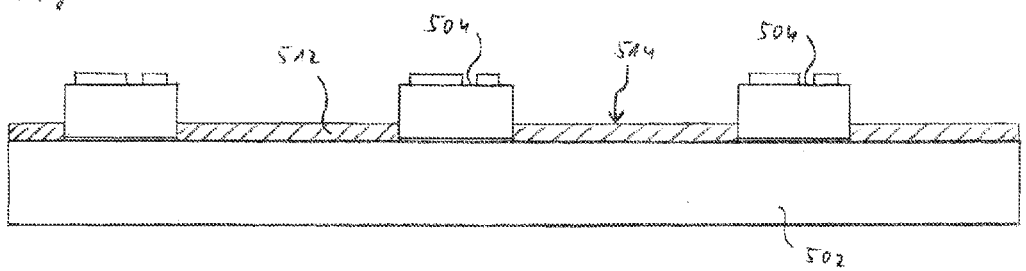

FIGS. 5A to 5C illustrate a variant of the manufacturing methods shown in the previous figures. In FIG. 5A a carrier 502 is depicted with power chips 504 soldered thereon. An adhesive foil 506 comprises cut-outs 508 corresponding to positions of the chips 504 mounted on the carrier 502. A material of the foil may comprise a b-stage curable polymer. As but one example, the foil 506 may be an implementation of an adhesive foil.

Foil 506 is shown in FIG. 5A in an upright position purely for the sake of illustration; the foil 506 need not necessarily be arranged in this way during a depositing process. FIG. 5B illustrates a configuration after a deposition of foil 506 onto carrier 502 (prior to pre-curing). While the free area of carrier 502 is covered mostly by foil 506, for reasons of depositing the foil 506 the cut-outs 508 have to larger than the footprint of chips 504, which leads to gaps 510 between adhesive material 512 of foil 506 and at least some side surfaces of the chips 504. According to other embodiments, a foil may have a lower coverage of the free carrier surface, for example, a coverage may correspond to a coverage as illustrated in FIG. 3A for the case of deposition of spots of adhesive material. In those embodiments, gaps between the adhesive foil and mounted chips or other semiconductor elements would be larger as illustrated in FIG. 5B.

According to FIG. 5C, the deposited adhesive foil 506 is pre-cured, which may be achieved by any of the corresponding techniques discussed herein. A flowability of the b-stage curable adhesive material 512 during the pre-curing may result in the adhesive 512 getting into direct contact with side surfaces of the chips 504, such that one or more of the gaps 510 of FIG. 5B disappear. For example, the adhesive 512 may form during pre-curing an adhesive layer 514 covering the free area of carrier 502. The further processing of the arrangement as shown in FIG. 5C may follow one or more of the corresponding aspects set forth for example with reference to FIGS. 2E to 2J.

A variant of one or more of the manufacturing methods illustrated before is shown in FIGS. 6A to 6C. According to FIG. 6A, chips 602 are mounted on a carrier 604 and a polymeric, e.g., adhesive layer 606 covers the free area of the carrier 604 between the chips 602. In contrast to, for example, the thin adhesive layer 212 in FIG. 2B, the adhesive layer 606 is thick in comparison to the height of the chips 602 and is illustrated in the example embodiment of FIG. 6A as having about the same height as the chips 602. According to other embodiments, a polymeric layer may have a thickness larger than the height of one or more chips mounted on a carrier. According to various embodiments, a thick polymeric layer may have, for example, a thickness of at least 50 micrometer, or at least 100 micrometer, or at least 200 micrometer, or more.

Figure 6A:
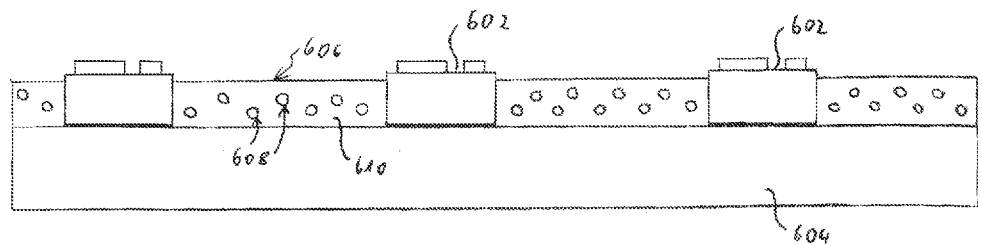
FIGS. 6A-6C illustrate a sixth embodiment of a manufacturing method for a semiconductor device.

Symbols 608 in FIG. 6A indicate a filler material forming part of or being mixed with a polymeric, e.g., adhesive material 610 of the adhesive layer 606. The filler 608 may comprise one or more of materials such as $SiO_2$ or similar glass-type or mineral materials such as $Al_2O_3$, $Si_3N_4$, AlN, BN, or PTFE or other electrically insulating filler materials including organic filler materials. The filler 608 may be present in the form of particles, fibers, prepreg materials, and/or any other fixed or fluidic (including gaseous) form.

The one or more filler materials 608 may be selected in order for the cured adhesive layer 606 achieving desired encapsulation properties such as mechanical stability, etc., and/or in order for achieving a desired CTE, for example, in order to achieve a CTE similar to that of the carrier and/or one or more of the semiconductor elements (chips) mounted on the carrier or affixed by the adhesive. For example, a filling material such as $SiO_2$ may be used with a filling degree of between about 5% to 95% by volume to achieve a CTE comparable to that of silicon (2.5), or that of copper (16.5). An appropriate adjustment of the CTE may lead to a decrease in mechanical stress and warping of the final semiconductor device/package.

Figure 6B:
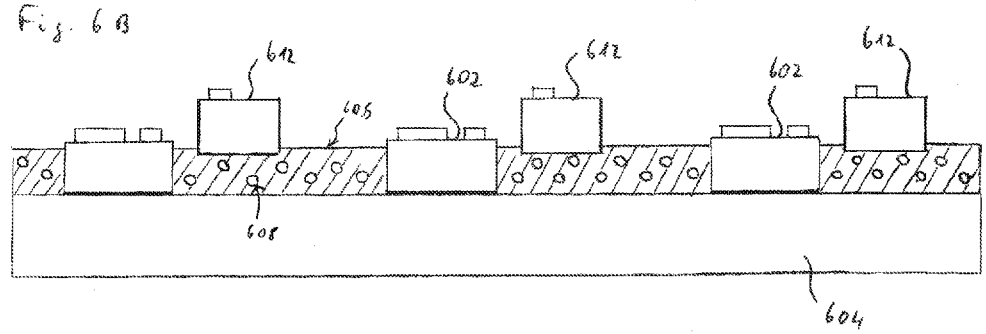
Figure 6C:
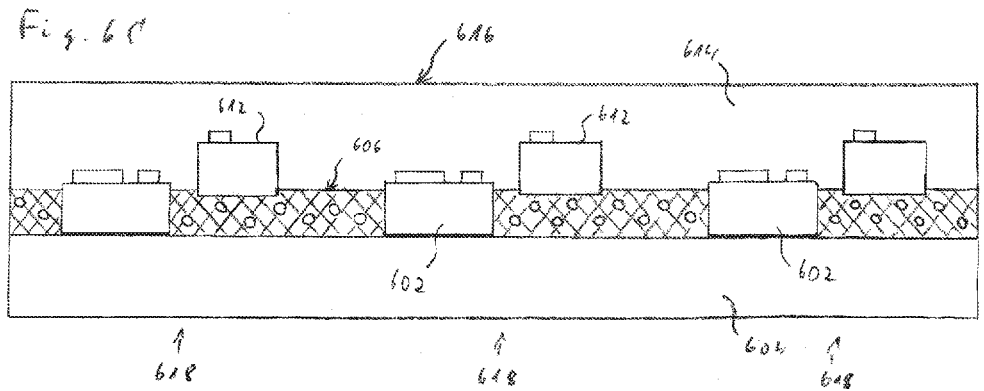

Referring to FIG. 6B, after pre-curing of the adhesive 610, semiconductor elements such as chips 612 are placed on top of the adhesive layer 606. After final curing of the adhesive 610, according to FIG. 6C, an encapsulation material 614 may be applied for encapsulation of the chips 602 and 612 (and optionally the carrier 604, if desired) for forming an encapsulation layer or body 616. As shown in FIG. 6C, both the adhesive material 610 and the encapsulation material 614 may contribute to an encapsulation of the resulting devices 618 regarding a volume and/or material (weight) perspective. A further manufacturing process may comprise one or more aspects as described with reference to FIGS. 2G to 2I, for example.

Figure 7:
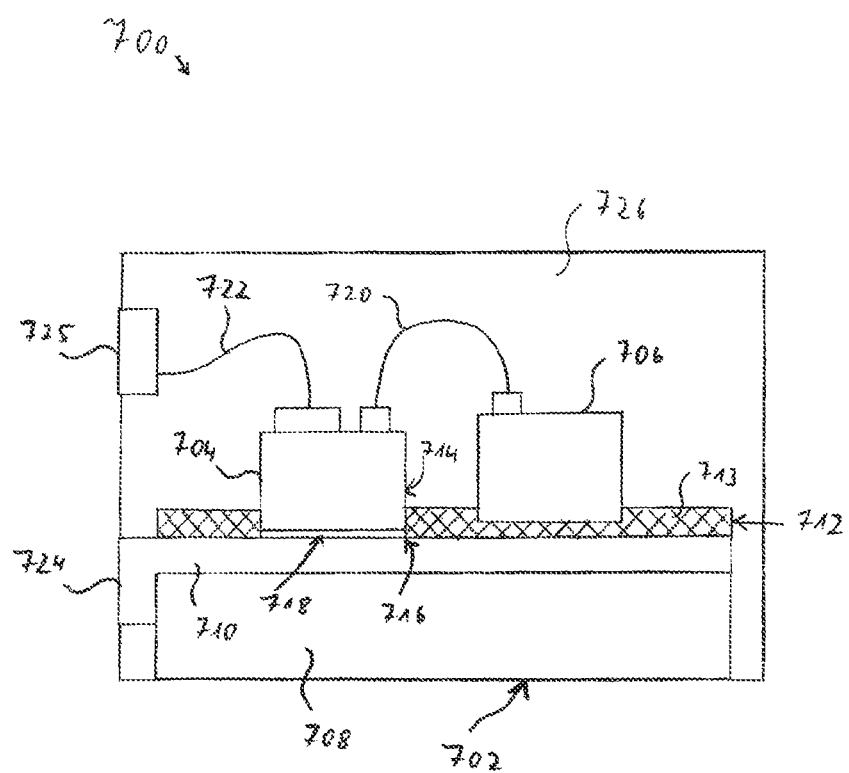
FIG. 7 schematically illustrates an embodiment of a semiconductor device.

FIG. 7 is a schematic cross-sectional view on a semiconductor device 700 comprising a carrier 702, a power chip 704, and a logic chip 706 for control of the power chip 704. The device 700 may have been manufactured according to one or more of the respective aspects discussed herein.

The carrier 702 may comprise an electrically insulating body 708 comprising, for example, a ceramic material. An electrically conducting layer 710 may be provided on at least a chip-carrying surface of body 708. The conducting layer 710 may comprise a layer or plate of a material comprising a metal or metal alloy, for example, or may be otherwise adapted for an electrical coupling of the power chip 704.

The power chip 704 may be soldered to the conductive layer 710 of carrier 702. An electrically insulating layer 712 supports the logic chip 706, i.e. the logic chip 706 is electrically insulated from the conductive layer 710. The layer 712 comprises a b-stage cured polymeric material 713, for example, a two-stage thermosetting polymer material. The insulating layer 712 is in direct contact with a side surface 714 of power chip 704 and covers in particular a lower edge 716 thereof. The direct contact of the polymer 713 of polymeric, e.g., adhesive layer 712 with the chip 704 may prevent a diffusion of solder material 718 to the side surfaces 714 of chip 704.

A wire bonding 720 provides for internal coupling of chips 704 and 706. The conductive layer 710 as well as a wire 722 connects the power chip 704 to external via connectors 724, 725. A molding block 726 encapsulates chips 704 and 706, wires 720 and 722, and at least a part of the carrier 702.

Figure 8:
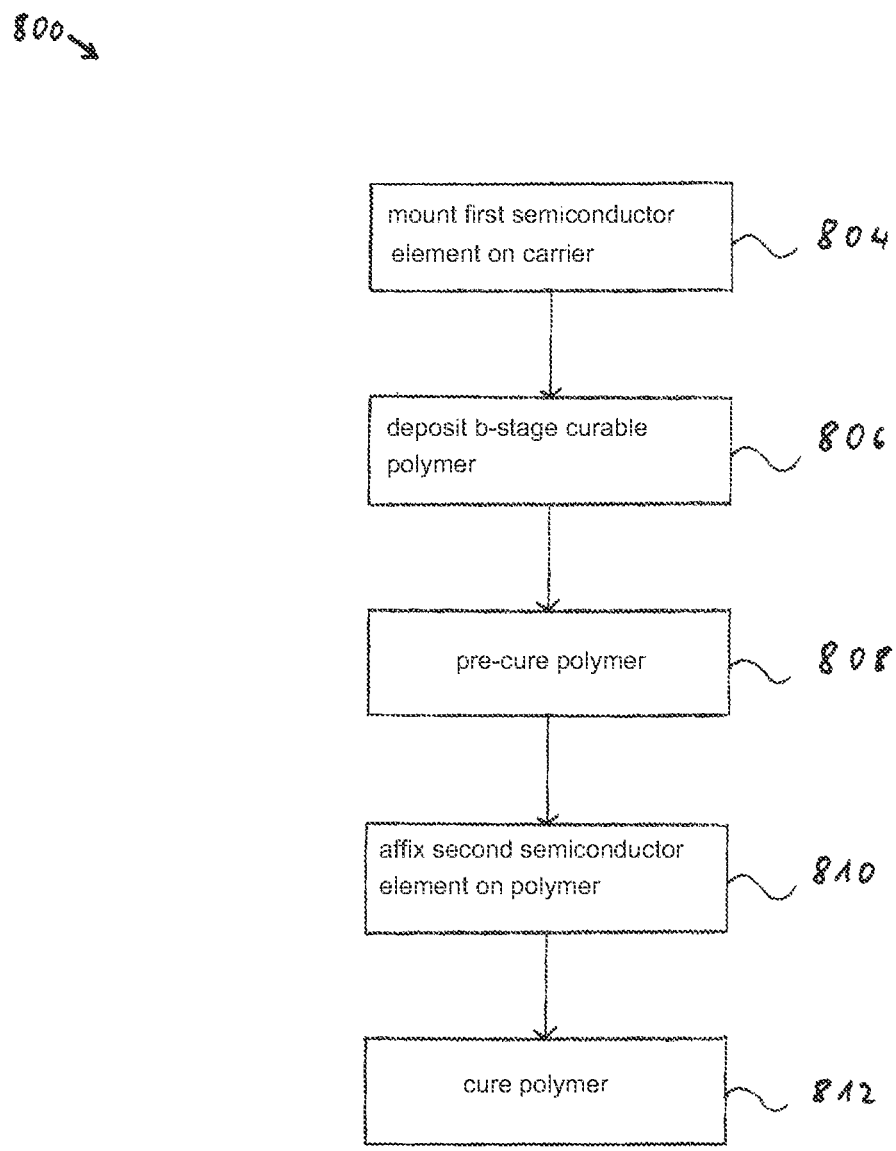
FIG. 8 is a flow diagram illustrating an embodiment of a method of using a b-stage curable polymer.

FIG. 8 is a flow diagram illustrating an embodiment 800 of a method of using a b-stage curable polymer. While the method 800 is shown as comprising a particular sequence of steps, it is to be understood that according to other embodiments the sequence of steps may be changed, and/or one or more of the steps may be performed in parallel to each other.

In step 804 a first semiconductor element is mounted on a carrier. In step 806 the b-stage curable polymer, for example, comprising an adhesive, is deposited on the carrier. The polymer may be deposited as a paste or a foil, for example. The polymer material may comprise a filler material. The polymer may get into direct contact with the first semiconductor element, in particular one or more side surfaces thereof, during or after the deposition step (before a pre-curing).

In step 808 the deposited polymer is pre-cured. The polymer may get into direct contact with the first semiconductor element during pre-curing. In other words, one or more direct contacts between the polymer and the first semiconductor element may be established during or after depositing the polymer, or during a pre-curing of the polymer, or both.

In step 810 a second semiconductor element is affixed on the polymer. This step may follow a pre-curing. The polymer may have electrically insulating properties; as a result, the second semiconductor element affixed thereto is electrically insulated from the carrier. In step 812 a final curing of the polymer material is performed which implies a final fixation of the second semiconductor element. The polymer material may be used for contributing to or achieving an encapsulation of at least one of the first semiconductor element, the second semiconductor element, and the carrier. Other steps can then be performed such as further processing of the cured b-stage polymer, for example, the provision of recesses or (through-) holes in the polymeric layer, etc.

As used herein, to the extent that terms such as "include," "have," "with," or variants thereof are used in either the detailed description or the claims, it is to be understood that such terms are intended to be inclusive in a manner similar to the term "comprise." The term "exemplary" is meant to merely denote one or an example, rather than the best or optimum example according to any given criterion.

While a particular feature or aspect of an embodiment of the invention may have been disclosed with respect to only one of several implementations, such feature or aspect may be combined with one or more other features or aspects of the other implementations as may be desired and advantageous for any given or particular application.

While specific embodiments have been illustrated and described herein, it will be appreciated by those of normal skill in the art that many modifications may be made, adaptations be performed and variants be implemented in view of the specific embodiments shown and described without departing from the scope of the present invention. Accordingly, it is intended that any such modifications, adaptations and variations of the specific embodiments discussed herein are covered and the invention be limited only by the scope of the claims.

What is claimed is:

1. A semiconductor device comprising:
   a carrier;
   a first semiconductor chip mounted on a planar surface of the carrier;
   a cured and cross-linked polymer disposed on the planar surface of the carrier, wherein the polymer is in contact with a side surface of the first semiconductor chip;
   a second semiconductor chip affixed on the planar surface of the carrier by the polymer, wherein a surface of the second semiconductor chip facing the carrier is in contact with the polymer, wherein the planar surface of the carrier facing the second semiconductor chip is in contact with the polymer, and wherein an outline of the second semiconductor chip is located completely outside of an outline of the first semiconductor chip when viewed in a direction perpendicular to the planar surface of the carrier; and
   an encapsulation body encapsulating the first semiconductor chip and the second semiconductor chip, wherein the carrier electrically couples the first semiconductor chip to a contact element comprising a planar surface exposed from the encapsulation body, and wherein the exposed planar surface of the contact element is perpendicular to the planar surface of the carrier.

2. The device of claim 1, wherein the polymer is in contact with at least a part of an edge of the first semiconductor chip.

3. The device of claim 1, wherein the contact of the polymer with the first semiconductor chip prevents a diffusion of solder material to the side surface of the first semiconductor chip.

4. The device of claim 1, wherein the polymer forms a layer on at least a portion of the carrier, the layer having a thickness less than a height of the first semiconductor chip.

5. The device of claim 1, wherein the polymer forms a layer on at least a portion of the carrier, the layer having a thickness of less than 50 micrometer.

6. The device of claim 1, wherein the carrier comprises a non-conductive substrate with a conductive coating.

7. The device of claim 1, wherein the first semiconductor chip is electrically coupled to the carrier, or wherein the second semiconductor chip is electrically insulated from the carrier by the polymer.

8. The device of claim 1, wherein the first semiconductor chip comprises a semiconductor power chip, and wherein the second semiconductor chip comprises a logic chip or a memory chip.

9. The device of claim 1, wherein the polymer comprises an electrically insulating filler material.

10. The device of claim 9, wherein the insulating filler material comprises at least one of $SiO_2$, $Si_3$, $N_4$, AlN, BN, PTFE.

11. The device of claim 1, wherein a coefficient of thermal expansion of the polymer is similar to a coefficient of thermal expansion of at least one of the carrier, the first semiconductor chip, and the second semiconductor chip.

12. The semiconductor device of claim 1, wherein the second semiconductor chip is affixed on the planar surface of the carrier exclusively by the polymer.

13. The semiconductor device of claim 6, wherein an outline of the first semiconductor chip is located completely inside of an outline of the conductive coating when viewed in a direction perpendicular to the planar surface of the carrier.

14. A semiconductor device comprising:
   a carrier;
   a conductive metal layer disposed on the carrier;
   a first semiconductor element disposed on a planar surface of the conductive metal layer;
   a cured and cross-linked polymer layer directly disposed on the planar surface of the conductive metal layer;
   a second semiconductor element directly disposed on the polymer layer, wherein an outline of the second semiconductor element is located completely outside of an outline of the first semiconductor element when viewed in a direction perpendicular to the planar surface of the conductive metal layer; and
   an encapsulation body encapsulating the first and second semiconductor elements,
   wherein the first semiconductor element is electrically connected to the conductive metal layer, wherein the polymer layer is in contact with sidewalls of the first semiconductor element,
   wherein the conductive metal layer electrically couples the first semiconductor element to a contact element comprising a planar surface exposed from the encapsulation body, and
   wherein the exposed planar surface of the contact element is perpendicular to the planar surface of the conductive metal layer.

15. The device of claim 14, wherein the polymer layer is in contact with sidewalls of the second semiconductor element.

16. The device of claim 14, wherein the first semiconductor element is a power chip and the second semiconductor element is a logic chip.

17. The device of claim 14, further comprising a first electrical connection between the first semiconductor element and the second semiconductor element.

18. The device of claim 17, wherein the first electrical connection is a first wire bond.

19. The device of claim 17, further comprising an external terminal, wherein the first semiconductor element is electrically connected to the external terminal via a second electrical connection.

20. The device of claim 19, wherein the second electrical connection is a second wire bond.

21. The device of claim 14, wherein the conductive metal layer comprises a planar section which is directly disposed on the carrier between the carrier and the first semiconductor element.

22. The semiconductor device of claim 14, wherein an outline of the first semiconductor element is located completely inside an outline of the conductive metal layer when viewed in a direction perpendicular to the planar surface of the conductive metal layer.

23. The semiconductor device of claim 14, wherein the complete polymer layer is separated from the carrier by the conductive metal layer.

24. The semiconductor device of claim 14, wherein the polymer layer comprises a first planar surface facing the carrier and a second planar surface opposite to the first planar surface and facing away from the carrier, wherein the planar surface of the conductive metal layer is parallel to the second planar surface of the polymer layer.

25. The semiconductor device of claim 24, wherein the planar surface of the conductive metal layer is in contact with the first planar surface of the polymer layer.

\* \* \* \* \*